United States Patent [19]

Lifshin et al.

[11] 4,357,395

[45] Nov. 2, 1982

[54] TRANSFER LAMINATION OF VAPOR DEPOSITED FOILS, METHOD AND PRODUCT

[75] Inventors: Eric Lifshin, Loudonville; Joseph D. Cargioli; Stephen J. Schroder, both of Schenectady; Joe Wong, Schenectady, all of N.Y.

[73] Assignee: General Electric Company, Schenectady, N.Y.

[21] Appl. No.: 180,341

[22] Filed: Aug. 22, 1980

[51] Int. Cl.³ .................. B21C 37/00; C25D 7/04; B21D 39/00; B32B 3/24

[52] U.S. Cl. .................. 428/607; 428/612; 428/914; 204/35 R; 156/233; 156/249; 156/DIG. 76

[58] Field of Search .............. 428/606, 607, 612, 618, 428/652, 200, 198, 352, 573, 603, 609, 675, 914; 204/35 R, 44, 3, 33; 156/233, 272, 289, 238, 239, 240, 244.17, 244.24, 249, 275, DIG. 76

[56] References Cited

U.S. PATENT DOCUMENTS

| | | | |
|---|---|---|---|
| 3,220,897 | 11/1965 | Conley et al. | 148/34 |
| 3,293,109 | 12/1966 | Luce et al. | 161/166 |
| 3,322,656 | 5/1967 | Dahringer | 204/38 |
| 3,328,275 | 6/1967 | Waterbury | 204/38 |
| 3,585,010 | 6/1971 | Luce et al. | 29/191.2 |
| 3,804,689 | 4/1974 | O'Connor | 156/247 |
| 3,857,681 | 12/1974 | Yates et al. | 29/195 |
| 3,918,926 | 11/1975 | Wolski et al. | 428/675 |
| 3,969,199 | 7/1976 | Berdan et al. | 204/33 |
| 3,984,598 | 10/1976 | Sarazin et al. | 428/35 R |
| 4,193,849 | 3/1980 | Sato | 204/38 B |
| 4,215,170 | 7/1980 | Oliva | 156/233 |

FOREIGN PATENT DOCUMENTS

| | | | |
|---|---|---|---|
| 1031555 | 6/1953 | France | 156/233 |
| 49-24366 | 12/1970 | Japan | 156/233 |
| 1437841 | 6/1976 | United Kingdom | 156/233 |

OTHER PUBLICATIONS

Pellegrino news item, (Electronics Packaging and Production, vol. 18, No. 11, p. 125, Nov. 1978).
Transactions of the Institute of Metal Finishing, by D. J. Arrowsmith (vol. 48, p. 88, 1970).

Primary Examiner—Edward C. Kimlin
Assistant Examiner—L. Falasco
Attorney, Agent, or Firm—Leo I. MaLossi; James C. Davis, Jr.

[57] ABSTRACT

A copper-clad laminate having special utility in printed circuit board production because of its extremely smooth and virtually pinhole-free surface is made by vapor depositing a copper film on a layer of silica on an aluminum carrier sheet, electrodepositing a layer of copper on the film to form a foil, bonding the foil to a substrate and finally stripping the foil and substrate laminate from the silica-coated carrier sheet.

8 Claims, 6 Drawing Figures

TRANSFER LAMINATION OF VAPOR DEPOSITED FOILS, METHOD AND PRODUCT

DEFINITIONS

As used herein, and in the appended claims, the term "carrier" includes aluminum sheet material which is of gauge thickness such that it can be run through a processing line and rolled for storage or shipment, and also includes such sheet material of other metals as well as of plastics, such as duPont commercial products known as MYLAR and KAPTON and other organic polymeric materials of similar flexibility which will withstand the processing temperatures involved in this invention and have the strength at the temperature of deposition of the copper film and the characteristics of inertness and bondability to release agent coatings necessary for coating adherence as copper-clad laminate products are stripped from the carrier sheets.

Likewise, by the term "release agent" we mean and include oxides in which the diffusivity of copper atoms is negligible under time and temperature conditions comparable to one atmosphere at 175 degrees C. Further, these are materials which will not bond to copper or other metal deposited as a film thereon as strongly as to the aluminum or other carrier sheet material and further will serve to prevent interdiffusion and also reaction between the copper film and the aluminum sheet or other carrier under conditions of production or use.

"Ultra-thin" designates thickness less than about 16 microns.

"Film" and "foil" in this same context mean respectively an ultra-thin vapor deposited coating and the combination of such coating and an electrolytically deposited bonding layer which is usually somewhat thicker than the film but of the same material which is preferably copper.

"Vapor deposition" means and includes sputtering, physical evaporation (i.e., electron beam, inductive and/or resistive evaporation), chemical vapor deposition, and ion plating.

"Substrate" as that term is used in this specification and in the appended Claims means and refers to that part of the copper-clad laminate product or other article of manufacture of this invention which serves as the physical support means for the metal film or foil being suitably a glass-epoxy body provided in the form of a prepreg for cure in contact with copper or other metal foil. Other materials useful for this purpose include, but are not limited to, that known in the trade as "phenolic paper resins" which are paper sheet products impregnated with a resin curable to provide an adhesive bond between the substrate and the metal foil of the laminate.

BACKGROUND AND SUMMARY OF INVENTION

This invention concerns the fabrication of copper-clad laminates useful in the production of printed circuit boards and, more particularly, it concerns itself with a novel method for producing such laminates and an improved laminate product, as well as novel intermediate products.

Copper-clad laminate is one of the raw materials used in the production of printed circuit boards. Such a laminate consists of a substrate having a foil of copper firmly adhered thereto. Producers of printed circuit board (PCB) products apply the desired circuit patterns in different ways. The most common method, known as subtractive processing, involves masking the desired pattern by a photoresist or screen printed masking material on the copper-clad laminate and then removing the undesired copper cladding by etching.

Another method for producing circuit patterns requires the use of a substrate clad with ultra thin copper. Masking is applied as described above. However, the copper is exposed in the area in which the circuit pattern is desired. Electrodeposition is then performed increasing the circuit line thickness after which the masking and thin background copper are removed by etching. This approach is known as the semi-additive method.

It is desirable, of course, to produce PCB's having the maximum number of circuit lines contained thereon. The more circuit lines, and consequently, the more components, that can be fit on to a single board, the more compact and economical the product becomes. One of the limiting factors, however, in the number of circuit lines that can be applied in a given amount of space is the degree of fineness with which such lines can be produced. Another limitation is the degree of precision with which the lines themselves and the spaces between them can be defined.

Those skilled in the art realize that it is desirable in light of the foregoing objectives and for other reasons to use relatively thin foils in the production of the basic laminate product which is to be used in the production of PCB's. With the subtractive process applied to thicker foils, there is greater wastage of copper when the background foil is etched away, as described above. Also, there is necessarily a certain amount of side etching of the circuit lines themselves, reducing the amount of current carrying material and altering the surface morphology of the circuit lines. Obviously, this gives rise to a further limitation in how closely the circuit lines can be spaced from one another. Where semi-additive processing of laminates clad with thin copper foil is used, these disadvantages are clearly minimized.

Foils for copper-clad laminate have been produced for the most part by electrodeposition up to the present time. This process has many advantages, including speed of production, economy and a very fully developed technology associated with it. There are, however, certain limitations inherent in the electrodeposition process when this technology is extended to the production of ultra-thin copper foils. For one thing, it is very difficult to produce foils of less than 16 microns thickness which are free of pinholes. The pinholes appearing in thinner electrodeposited foils result in our opinion from the presence of impurities or defects at random locations on the surface of the electrode upon which deposition is occurring or as a result of entrapment of impurities inherent in the electrodeposition process. These impurities thus prevent electrodeposition at these locations creating pinholes which may close only when a certain thickness is achieved.

Furthermore, another limitation of the electrodeposition process results from the relatively large average grain size in films or foils produced thereby. With ultra-thin films or foils, particularly those in the very thinnest ranges, the average depth of the grain boundaries begins to approximate the thickness of the films themselves. Since some organic impurities will generally be collected at points in the grain boundaries there is a possible weakening of such films or foils at these points.

We have found that the foregoing disadvantages associated with the production of copper foils solely by electrodeposition can be overcome by our novel process. With our process it becomes possible to use ultra-thin foils. Also, copper-clad laminate produced in accordance with our invention offers an extremely smooth and virtually pinhole-free surface for the subsequent electrodeposition of circuit lines. Because of the uncommonly high quality and defect-free character of this surface, the overall circuit so produced by semiadditive processing will be superior in definition than has heretofore been possible. Since the foil can be thinner, the amount of etching required to remove the background copper is less, thereby tending to diminish the disadvantages associated with that process as noted above. The result of these advantages is that the laminate and the printed circuit boards produced therefrom can be made more economically, thereby lowering the cost to users. It should be noted, however, that our novel process and product have advantages over their existing counterparts even in thick foil applications. Hence, our invention is not limited strictly to the production and use of laminate with ultra-thin foils.

Briefly described, our method involves the vapor deposition of a film of metal, preferably copper, on a carrier such as aluminum sheet in such a way as to produce a relatively weak adherent bond therewith. In our method, we prevent strong adhesion between the film and the aluminum carrier sheet by coating the sheet with silicon dioxide or another substance suitable for the purpose. The thickness of that coating may, for example, be as thin as 200 to 600 Angstroms and may be much thicker up to the point that the physical integrity of the coating is not sufficient for the coating to withstand the stripping or other foil separation step described herein. After the production of the film on the carrier sheet, the exposed surface of the vapor deposited film is given an electrolytic treatment to develop the bonding layer to complete the foil for its ultimate lamination with an appropriate substrate such as glass epoxy. Next, the exposed surface of the completed foil is pressed against the intended substrate at appropriately elevated temperatures to bring about the intended lamination by embedding the bonding layer in the substrate. Once the lamination is completed, the carrier sheet can be left in place to serve as a protective covering. At a later time the carrier sheet may be stripped away taking the coating of release agent with it and leaving the copper foil with its vapor deposited surface exposed. Since that surface was produced by vapor deposition, it will have an average grain size on the order of 500 Angstroms or less which is about a factor of 20 smaller than the grain size associated with electrolytically deposited copper.

In a similar method the coating of release agent and copper foil are applied to a stiff, flat, smooth, metal surface, e.g., a stainless steel press pan.

Likewise briefly described, a metal clad laminate product of this invention comprises a substrate and a metal foil adhering thereto, the foil including an electrolytically-deposited bonding layer embedded into the substrate and further including a vapor deposited film overlying and integral with the bonding layer and providing an exposed surface of relatively small grain size for the laminate.

Similarly another product of this invention comprises a carrier sheet coated with a release agent which preferably takes the form of a layer of vapor deposited silica.

Still another of these new products, broadly and generally defined, is a copper-clad laminate of a carrier sheet coated with a release agent and a copper film covering and adhering to the release agent, the copper film having an average grain size of about 500 Angstroms in its surface in contact with the release agent.

DETAILED DESCRIPTION OF THE INVENTION

Figure 1:
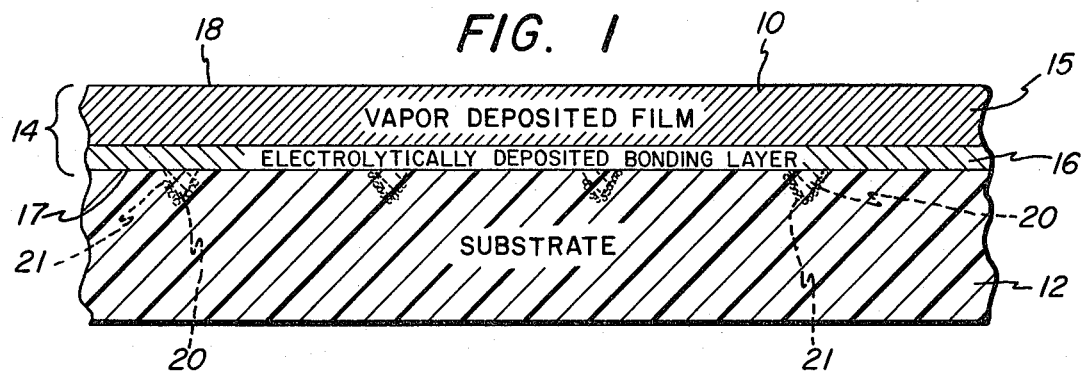
FIG. 1 is a schematic diagram representing a cross sectional view of a laminate product of this invention.

As illustrated in FIG. 1, the product of this invention is a laminate 10 comprised of a substrate 12 having a foil of copper 14 adhering thereto. Foil 14 consisting of a vapor deposited film 15 and an electrolytically deposited bonding layer 16 has a surface 17 of irregular nodular appearance embedded in substrate 12. Thus, nodules or dendrites 20 project from layer 16 and have club-headed portions 21 formed on them which provide re-entrant cavities for mechanical interlocking of foil 14 with substrate 12.

Figure 2:
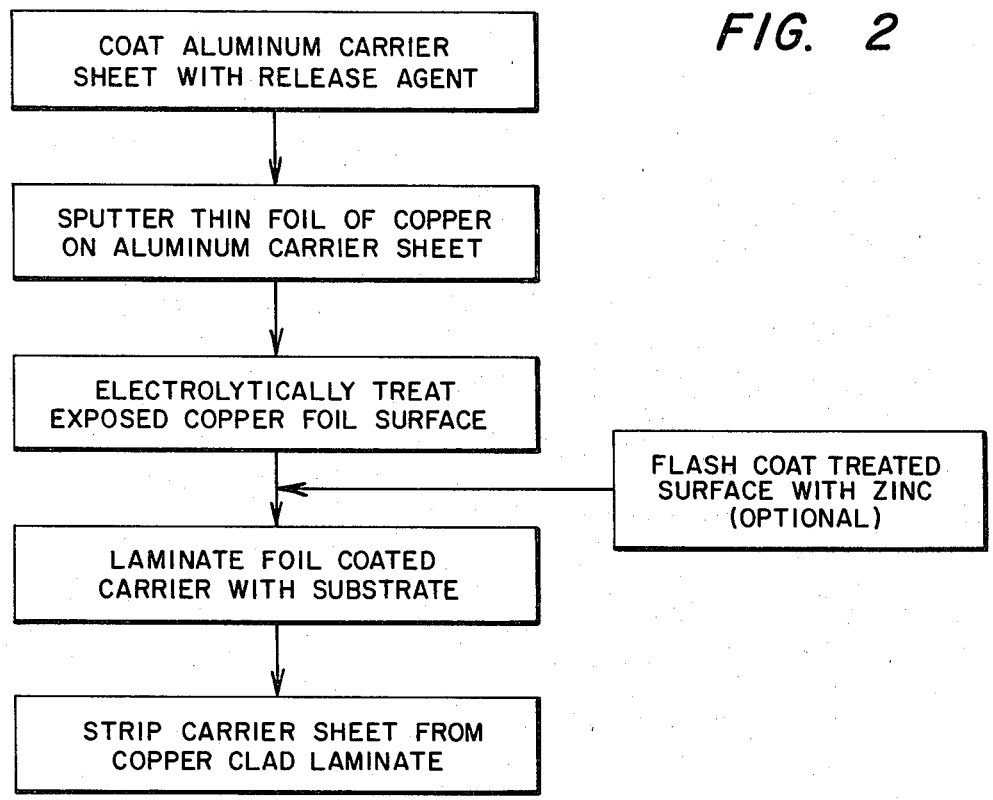
FIG. 2 is a flow diagram illustrating the steps to be followed in practicing the method of this invention to produce a copper-clad laminate.

FIG. 2 illustrates the preferred method of this invention. First, an aluminum carrier sheet, preferably of thickness from one to seven mils but possibly thinner or much thicker, is coated with a suitable substance which tends to form a relatively weak bond with copper. Such substances, known and designated herein as release agents, are silicon dioxide, silicon oxide or soda-lime window glass or other materials capable of serving this purpose satisfactorily. A coating of silicon dioxide may be applied by sputtering, chemical vapor deposition or electron beam evaporation techniques known to those skilled in the art.

Once the aluminum carrier sheet is suitably coated, a copper coating is applied thereto by sputtering or another vapor deposition process. The deposited coat is suitably an ultra-thin film, but may be much thicker as up to 25 microns. The advantage of vapor deposition is that a smooth, continuous and virtually pinhole-free coat of copper will result even in such thin sections.

The next step in the process is the electrolytic treatment of the exposed surface of the copper coat to promote bondability. As is well known greatly increased mechanical interlocking of a copper film or foil to a glass epoxy substrate can be achieved by altering the morphology of the copper surface that is to be bonded. One well known method of accomplishing this is described in an article which appeared in the "Transactions of the Institute of Metal Finishing" (Vol. 48, Page 88, 1970) by D. J. Arrowsmith. This procedure involves the electrolytic treatment of a copper surface in one embodiment in baths containing progressively weaker concentrations of copper sulfate maintained at different temperatures. In another embodiment which has been found satisfactory for some applications with the present invention, the treatment can be accomplished with the use of a single bath. The treatment of the surface of the copper film or foil in successive baths or with the single bath technique dramatically increases the adhesive strengths ultimately formed between the substrate and the copper coat. This comes about due to the formation of highly irregular and dendritic or nodular structures on the surface of the copper. The Arrowsmith article and parts thereof concerned with dendritic structures and their production and use are incorporated herein by reference. The average grain size of the copper layer resulting from the application of the Arrowsmith technique will, as those skilled in the art realize, be considerably larger than that produced in the vapor deposited layer.

At this point the roughened surface of the resulting copper foil may be flash-coated with zinc by electrodeposition. This is a well known step for producing a protective brass layer which forms upon the application of heat during the lamination step which follows.

The lamination step is accomplished in the conventional manner by pressing the treated surface of the foil against treated glass epoxy prepreg sheet material. This is done at sufficiently elevated temperatures so that the epoxy will initially be fluid enough to permit it to flow in and around the irregular surfaces of the copper foil which, upon curing, will produce strong mechanical interlocking therewith. The resulting peel strengths, using the standard Jacquet 90° peel test will be 8 pounds/inch or more, thus placing them in a very acceptable commercial range.

The final step concerns the removal of the aluminum carrier. This is accomplished by mechanically stripping the carrier away from the laminate product. The release agent, whether silicon dioxide, silicon oxide or another remains with the carrier and the metal surface of the laminate product is consequently entirely free therefrom. The resulting product is one having a copper cladding which is continuous, smooth and virtually pinhole-free. As noted earlier, the exposed surface of the copper cladding is of relatively small average grain size. The resulting product, having a copper surface of such superior qualities is indeed ideal for the subsequent production of circuit boards.

Figure 3:
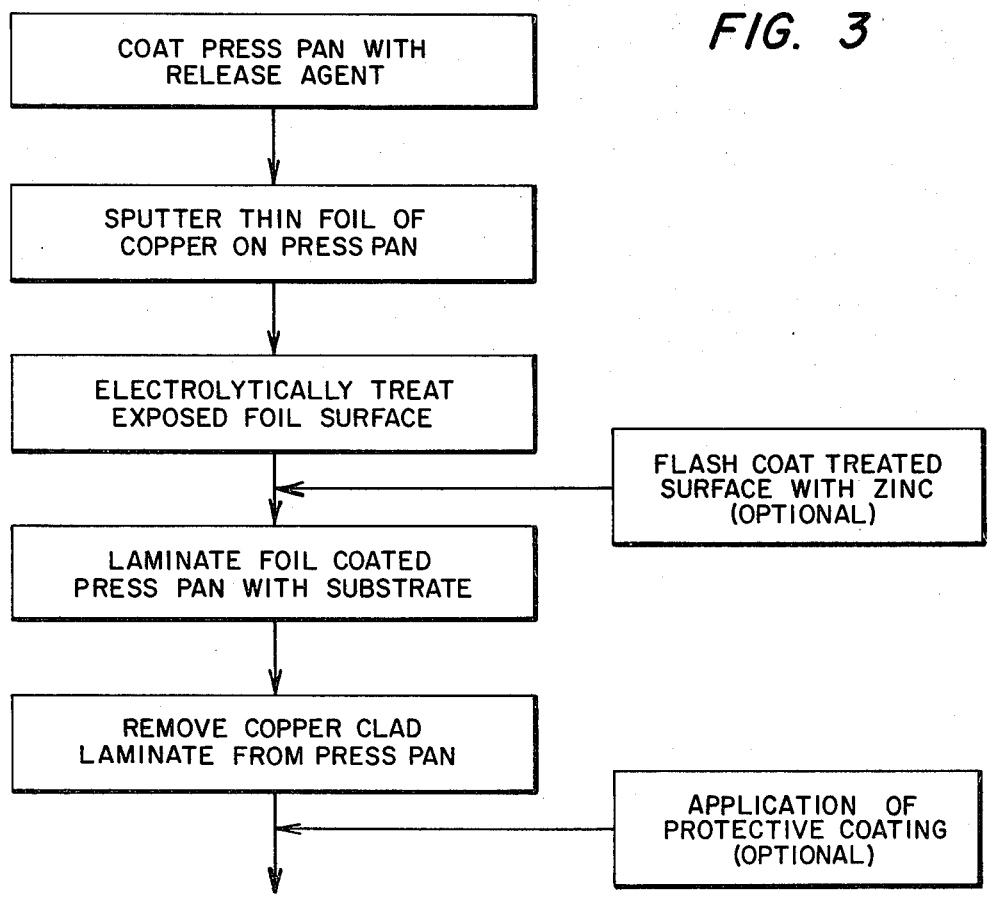
FIG. 3 is a flow diagram illustrating the steps to be followed in an alternate method of this invention to produce a copper-clad laminate.

FIG. 3 illustrates an alternate embodiment of the inventive method which involves the substitution of a stainless steel press pan for the aluminum carrier. The difference between these two processes is reflected primarily in the final step of withdrawing the press pan from the laminate product as opposed to having to mechanically strip the aluminum carrier therefrom. In all other respects, however, the processes are quite similar with the exception that stripping is done at the time of lamination instead of at the conclusion of production, the press pan being recycled; and with the further exception that after the laminate is removed from the press pan, the surface of the laminate may be given a peelable metallic or polymeric physically protective coating because of its fragile nature. The latter step is the second optional one indicated in FIG. 3.

Figure 4:
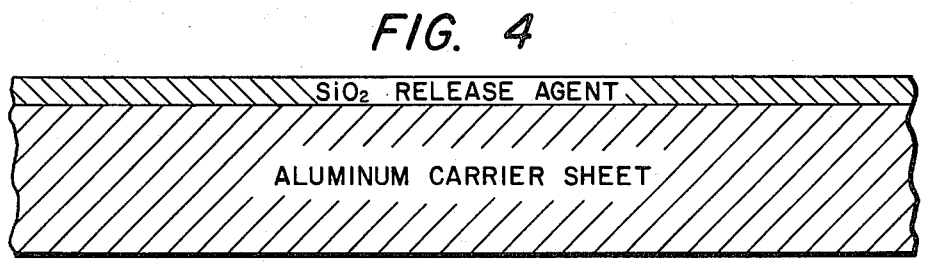
FIG. 4 is a schematic diagram representing a cross sectional view of a product according to the present invention.
Figure 5:
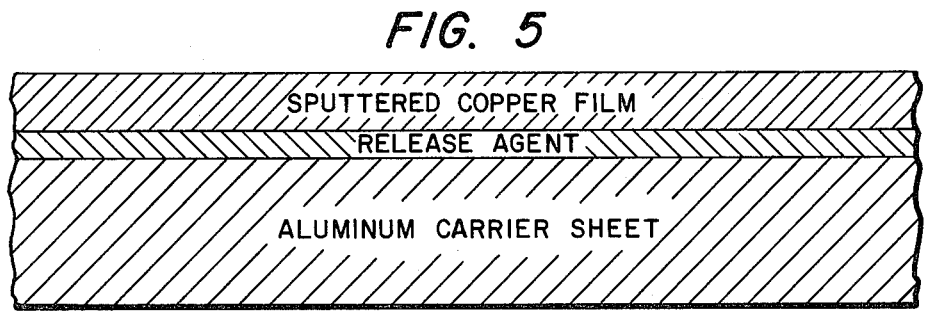
FIG. 5 is a schematic diagram representing a cross sectional view of another product according to the present invention.
Figure 6:
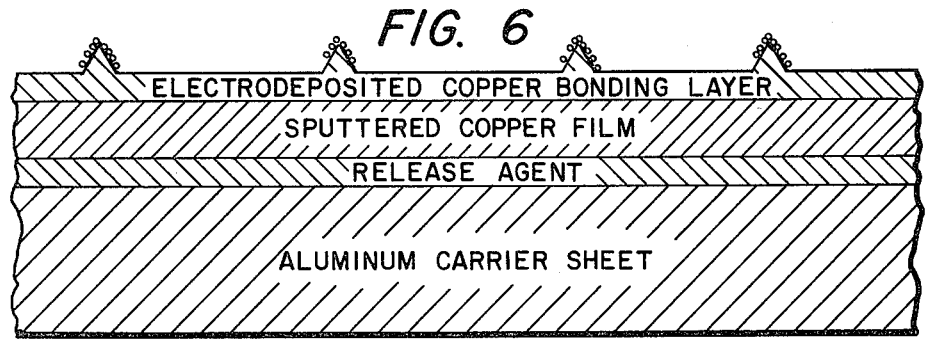
FIG. 6 is a schematic diagram representing a cross sectional view of still another product according to the present invention.

It will be appreciated that the commercialization of this invention can be accomplished in various ways. For example, manufacturers may find it convenient to market the aluminum carrier sheet, coated with a suitable release agent and with or without a copper film or heavier coat applied thereto by vapor deposition. In some instances it might be advantageous to proceed to the further step of electrolytically depositing a copper bonding layer to the copper film or coat, as described above. Thus, three intermediate products of this invention that would be useful in the production of copper-clad laminates for ultimate use in fabricating circuit boards are illustrated in FIGS. 4, 5 and 6. Purchasers, of course, could easily proceed with these intermediate products to the ultimate fabrication of copper-clad printed circuit boards.

The following are four examples illustrating the process of this invention and results achieved:

EXAMPLE I

A number of 5-micron thick sputtered copper films were prepared on an aluminum carrier sheet previously coated with silicon dioxide. Each film was electroplated to form a foil in a bath consisting of 220 g/liter of $CuSO_4.5H_2O$ with 100 g/liter of $H_2SO_4$ at 40° C. Moderate agitation was used with plating times varying between 30 seconds and 5 minutes at current densities in the range of 1 amp/square inch to 4 amps/square inch. Each foil was then electroplated in a second bath consisting of 80 g/liter of $CuSO_4.5H_2O$ and 100 g/liter of $H_2SO_4$ at 20° C. A little agitation was used with a current density of 1 amp/square inch and plating times of 30 seconds to 3 minutes. Following this treatment, a flash coating of zinc was electrodeposited on the exposed surface of the copper from a zinc chloride bath at 3 amps/square inch for 5 seconds. Next, the treated copper foils were placed against a glass epoxy prepreg sheet which in cured form is known in the trade as FR4 Board. Using usual lamination technique and applying pressure of about 60 psi while maintaining a temperature of about 170° C. for 40 minutes, the curing was fully accomplished. After cooling and removal from the lamination press, the aluminum carriers were stripped from the laminated assembly leaving the intended laminate product. The peel strengths were all in the range of 10 to 12 pounds per inch.

EXAMPLE II

In another experiment like that of Example I the same procedure was followed with the exception that the first electroplating step was omitted. The peel strengths of the resulting laminate products were found, however, to be substantially the same as those measured in Example I.

EXAMPLE III

In still another experiment involving the novel concepts of this invention the procedure of Example I was used except that instead of using foils as described there several 5-micron thick sputtered copper films were prepared on an aluminum carrier sheet which was sputter coated with soda-lime window glass instead of silicon dioxide. This different release agent layer produced by the sputtering technique was found to function essentially like the release agent layers used in the experimental runs of Examples I and II.

EXAMPLE IV

A number of 5- and 10-micron thick sputtered copper foils were prepared on stainless steel press pans previously coated with silicon dioxide. Each foil was electroplated in a bath consisting of 220 g/liter of $CuSO_4.5$-

H₂O with 100 g/liter of H₂SO₄ at 40° C. Moderate agitation was used with plating times varying between 30 seconds and 5 minutes at current densities in the range of 1 amp/square inch to 4 amps/square inch. Each foil was then electroplated in a second bath consisting of 80 g/liter of CuSO₄·5H₂O and a current density of 1 amp/square inch and plating times of 30 seconds to 3 minutes. Following this treatment, a flash coating of zinc was electrodeposited on the exposed surface of the copper foil from a zinc chloride bath at 3 amps/square inch for 5 seconds. Next, the treated foils were used in the lamination process described in Example I. After cooling and removal from the lamination press, the stainless steel press pans were stripped from the laminated assembly leaving the intended laminate product. The peel strengths were all in the range of 10 to 12 pounds per inch.

We claim:

1. A metal-clad laminate product for use in printed circuit board production, said product consisting essentially of:
   a substrate, and
   a metal foil adhering to said substrate, said foil consisting essentially of a vapor deposited metal coating integral with an electrolytically deposited metal bonding layer, said vapor deposited metal coating having an average grain size on the order of 500 Angstroms to provide a continuous, smooth, virtually pinhole-free outer surface for said laminate product and said bonding layer being formed with projecting metallic portions, said projecting metallic portions being embedded in said substrate with material of said substrate being in direct contact with the metal surfaces of said projecting metallic portions.

2. The invention of claim 1 wherein said projecting metal portions are nodular in form defining re-entrant cavities and wherein the substrate material is shaped to fill such cavities, whereby the adhesion between the substrate and the foil is due at least in part to mechanical interlocking.

3. The invention of claim 1 wherein the metal is copper.

4. The invention of claim 1 wherein the adhesion is sufficient to produce peel strengths in excess of 8 pounds per inch.

5. The invention of claim 1 wherein the exposed surface of said bonding layer is coated with a relatively thin layer of brass.

6. A copper-clad laminate product consisting essentially of:
   a carrier sheet,
   a coating of a release agent covering one major surface of said carrier sheet and
   a copper foil weakly bonded to said release agent, said foil consisting essentially of a vapor deposited copper coating integral with an electrolytically deposited copper-containing metallic bonding layer, said vapor deposited copper coating having an average grain size on the order of 500 Angstroms to provide a continuous, smooth, virtually pinhole-free surface in contact with said release agent and said bonding layer having projecting metallic portions formed on the major surface thereof away from said vapor deposited copper coating.

7. The invention of claim 6 in which the projecting metallic portions comprise nodular deposits.

8. The invention of claim 6 in which the projecting metallic portions are dendritic.

* * * * *